(12) United States Patent
Pradhan et al.

(10) Patent No.: US 9,337,314 B2
(45) Date of Patent: May 10, 2016

(54) TECHNIQUE FOR SELECTIVELY PROCESSING THREE DIMENSIONAL DEVICE

(71) Applicant: Varian Semiconductor Equipment Associates, Inc., Gloucester, MA (US)

(72) Inventors: Nilay A. Pradhan, Somerville, MA (US); Benjamin Colombeau, Salem, MA (US); Naushad K. Variam, Marblehead, MA (US); Mandar B. Pandit, Santa Clara, CA (US); Christopher Dennis Bencher, Cupertino, CA (US); Adam Brand, Palo Alto, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 11 days.

(21) Appl. No.: 14/103,329

(22) Filed: Dec. 11, 2013

(65) Prior Publication Data

US 2014/0162414 A1    Jun. 12, 2014

Related U.S. Application Data

(60) Provisional application No. 61/736,276, filed on Dec. 12, 2012.

(51) Int. Cl.
*H01L 21/00* (2006.01)
*H01L 29/66* (2006.01)
*H01L 21/311* (2006.01)
*H01L 21/265* (2006.01)

(52) U.S. Cl.
CPC .... *H01L 29/66795* (2013.01); *H01L 21/26513* (2013.01); *H01L 21/31122* (2013.01); *H01L 21/26586* (2013.01); *H01L 29/66803* (2013.01)

(58) Field of Classification Search
CPC ............ H01L 21/265; H01L 21/31122; H01L 29/66795; H01L 29/66803
USPC ................................. 438/156–166, 714, 725
See application file for complete search history.

(56) References Cited

U.S. PATENT DOCUMENTS

| | | | |
|---|---|---|---|
| 7,005,385 B2 | 2/2006 | Kundalgurki | |
| 8,664,657 B2* | 3/2014 | Duesberg et al. | 257/49 |
| 2009/0309230 A1* | 12/2009 | Cui et al. | 257/773 |
| 2011/0171795 A1 | 7/2011 | Tsai et al. | |
| 2012/0094455 A1* | 4/2012 | Cho | H01L 27/0207 438/270 |
| 2012/0129301 A1* | 5/2012 | Or-Bach et al. | 438/129 |
| 2013/0143372 A1* | 6/2013 | Kim et al. | 438/163 |

* cited by examiner

*Primary Examiner* — H Tsai

(57) ABSTRACT

A method to selectively process a three dimensional device, comprising providing a substrate having a first surface that extends horizontally, the substrate comprising a structure containing a second surface that extends vertically from the first surface; providing a film on the substrate, the film comprising carbon species; and etching a selected portion of the film by exposing the selected portion of the film to an etchant containing hydrogen species, where the etchant excludes oxygen species and fluorine species.

19 Claims, 3 Drawing Sheets

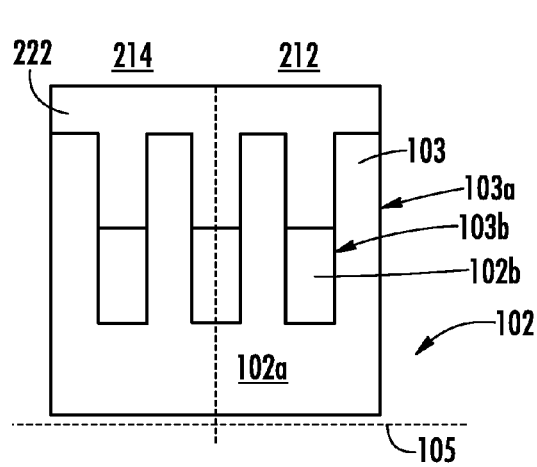
FIG. 2A
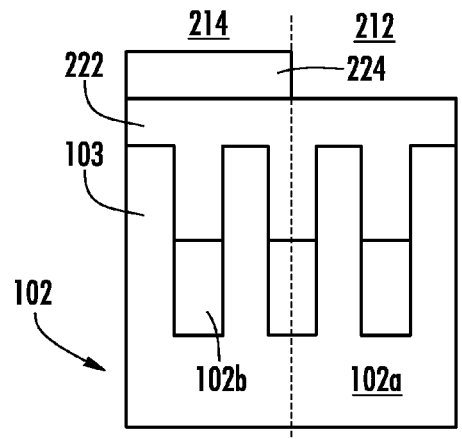
FIG. 2B
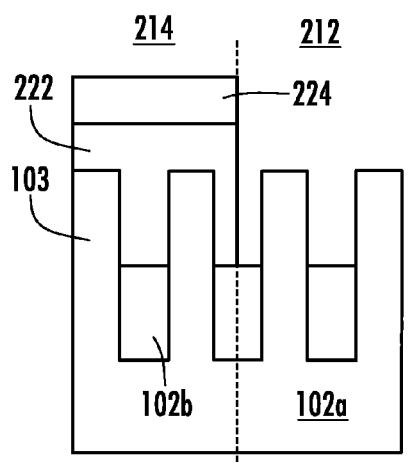
FIG. 2C
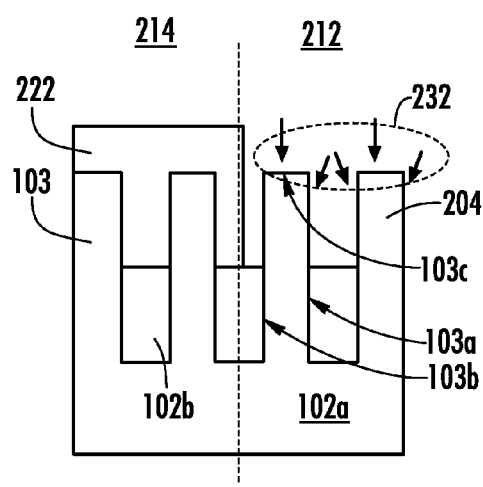
FIG. 2D
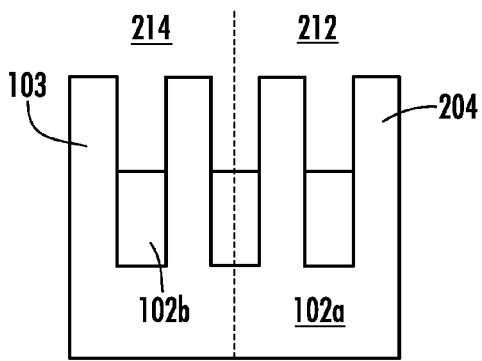
FIG. 2E
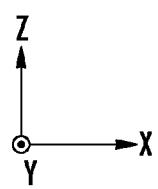

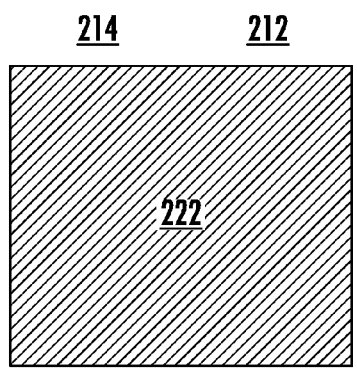
FIG. 3A
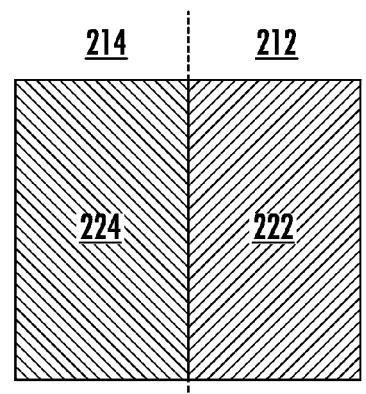
FIG. 3B
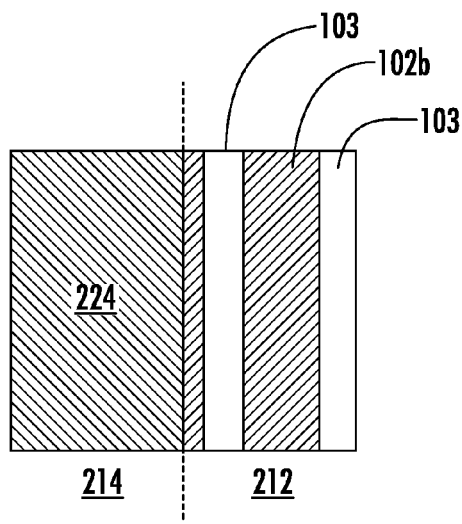
FIG. 3C
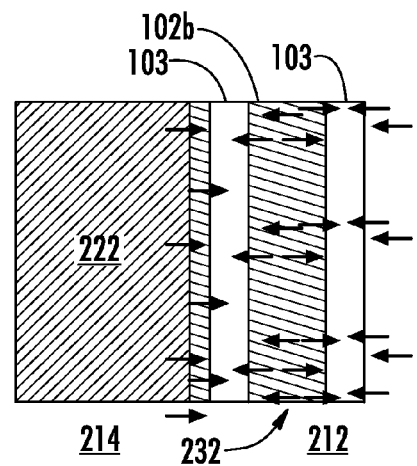
FIG. 3D
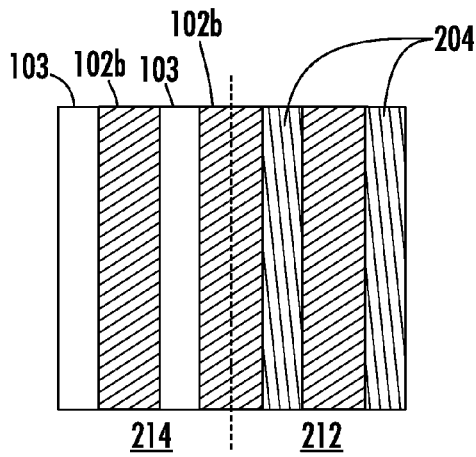
FIG. 3E
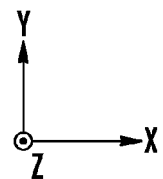

TECHNIQUE FOR SELECTIVELY PROCESSING THREE DIMENSIONAL DEVICE

RELATED APPLICATIONS

This application claims priority to U.S. Provisional Patent Application Ser. No. 61/736,276, filed Dec. 12, 2012.

FIELD

The present embodiments relate to processing of field effect transistors, and more particularly selectively processing of non-planar field effect transistors.

BACKGROUND

In response to an increased need for smaller electronic devices with higher circuit density, devices with three dimensional (3D) structures have been developed. An example of such device includes FinFET device having a conductive fin-like structure that are raised above the horizontally extending substrate. In conventional processing, a FinFET device substrate may comprise a semiconducting base, for example silicon (Si), and an oxide layer formed thereon. In other examples, a FinFET may be a silicon-on-insulator substrate. A conventional FinFET device includes a fin structure raised above the substrate and a gate structure that wraps around three sides of the fin structure along a portion of its length.

At various instances during fabrication of a FinFET device the fin structure may be subject to doping. For example dopants may be introduced into a region to form the channel of the field effect transistor being built in order to control threshold voltage. In fabrication of complementary metal oxide semiconductor (CMOS) devices using FinFET transistors, other implantation may be performed to generate n-wells or p-wells to isolated transistors of one dopant type from those of another dopant type. Additional implants that may reduce punch through such as halo, pocket or delta doping are also possible. In addition, when a gate structure is present, dopants can be introduced into the fin structure in regions that are not covered by the gate in order to form source/drain (S/D) regions or S/D extension regions.

One process that is used to dope the fin structure may be an ion implantation process. In this process, dopants having desired species may be directed toward the fin structure in a form of ions, and implanted therein. Although effective in doping, the ion implantation process is an energetic process which causes amorphization in the region within which the dopants are implanted. When used to implant dopants into the fin structure, the ion implantation process may cause the fin structure, which is otherwise mono-crystalline (single crystalline), to amorphize. Generally, the amorphization may be remedied with a post-implant process such as rapid thermal processing (RTP). As the width of the fin structure scales to 20 nm or less, however, excessive amorphization may be partially remedied with RTP or other post-implant processes. Even if remedied with the RTP process, the fin structure or portions of the fin structure may be in undesirable polycrystalline state after RTP processing.

To avoid excessive amorphization of the fin structure, the implantation process in principle may be performed at a higher temperature, such as up to or greater than 500° C. The ion implantation at this temperature or above, however, precludes the use of photoresist, which is used to mask portions of the FinFET device that are not to be implanted during a given implantation process. As such new processes are needed to fabricate three dimensional devices such as FinFETs. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

A new technique for selectively processing a three dimensional device is provided. In accordance with one exemplary embodiment, the technique may be realized as a method for selectively process a three dimensional device. The method may comprise: providing a substrate having a first surface that extends horizontally, the substrate comprising a structure containing a second surface that extends vertically from the first surface; providing a film on the substrate, the film comprising carbon species; and etching a selected portion of the film by exposing the selected portion of the film to an etchant containing hydrogen species where the etchant excludes oxygen species and fluorine species.

In a further embodiment a method to process a FinFET device includes providing a substrate having a first surface that extends horizontally, the substrate comprising a fin structure having a pair of opposed surfaces extending vertically from the first surface; providing a film on the substrate, the film comprising carbon species; etching a selected portion of the film that covers the fin structure by exposing the selected portion of the film to an etchant containing hydrogen species and excluding oxygen species and fluorine species, wherein an exposed fin region is formed on the fin structure; and performing an ion implantation process into the exposed fin region to introduce a dopant at a substrate temperature of greater than 300° C.

BRIEF DESCRIPTION OF THE DRAWINGS

FIGS. 2A-2E present an exemplary process flow for processing a 3D device, shown in side cross-sectional view.

FIGS. 3A-3E present an exemplary process flow for processing a 3D device, shown in top plan view.

DETAILED DESCRIPTION

Figure 1:
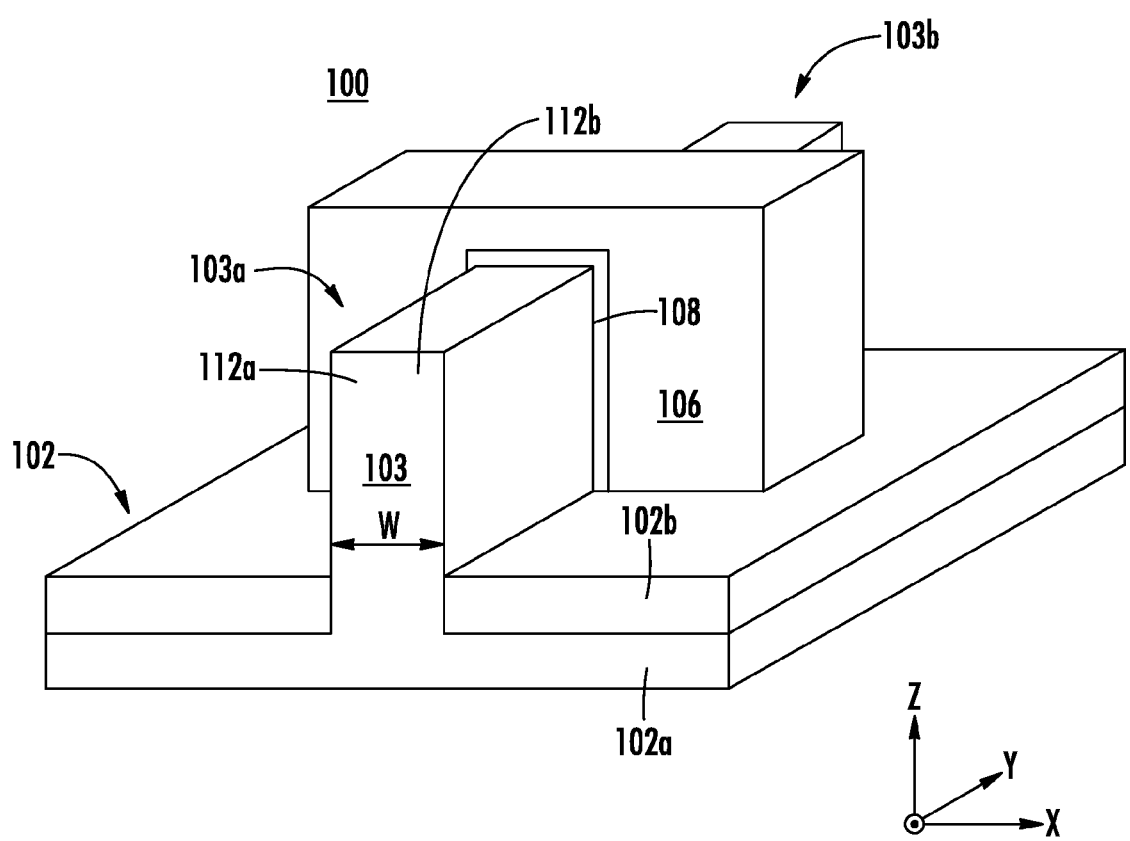
FIG. 1 illustrates an exemplary finFET structure.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned FinFET devices, embodiments are described herein that provide improved techniques for forming FinFET devices. The present embodiments in particular provide novel processing sequences that may simplify manufacturing of finFET devices and improve device performance. In various embodiments, the FinFET devices may be transistors that form part of a CMOS device in which FinFET transistors of two different polarities are formed.

Referring to FIG. 1, there is shown a FinFET device 100 formed on a substrate 102 consistent with the present embodiments. In one embodiment, the substrate 102 may comprise a semiconducting, for example silicon (Si), base 102a and an oxide layer 102b formed thereon. In another embodiment, the substrate 102 may be a silicon-on-insulator substrate. The FinFET device 100 may also comprise a fin structure 103 raised above the substrate 102 and a gate structure 106 formed across the fin structure 103. The gate structure 106 is spaced apart and isolated from the fin structure 103 by a gate dielectric 108. In the FinFET device 100, the fin structure 103 may serve as the source, drain, and the channel. For example, a source 103a and a drain 103b may be disposed within the fin structure 103 on opposite sides of the gate structure 106. Meanwhile, a portion of the fin structure 103 in contact with the gate dielectric 108 may be the effective channel region (not shown).

Depending on the type of dopants in which the fin structure 106 is doped, the FinFET device 100 may be a p-type or n-type FinFET device. For example, a fin structure 106 doped with p-type dopants may result in p-type FinFET, whereas a fin structure 106 doped with n-type dopants may resulting in n-type FinFET. Much like prior CMOS devices, a plurality of p-type and n-type FinFET devices form a CMOS FinFET device.

Consistent with the present embodiments, the fin structure 106 may be implanted using a high temperature ion implantation process to introduce dopants into the fin structure 103 according to the desired device characteristics. In particular embodiments, the high temperature ion implantation process is performed at a temperature that is sufficient to generate a single crystalline fin structure 106 after ion implantation and post implantation annealing. In this process, dopants having desired species may be directed toward the fin structure 106 in a form of ions, and implanted therein. In various embodiments the fin structure 103 may have a width of 30 nm along the X-axis of the Cartesian coordinates system illustrated or less. In some embodiments, the width of the fin structure 103 may be 20 nm or less. The fin structure 103 includes single crystalline regions 112a and 112b that are integral with the rest of the fin structure 103 such that the fin structure 103 forms a doped single crystalline material throughout. This structure is not achievable through conventional processing which employs an ion implantation process that causes the fin structure 103 to form amorphous regions that are not entirely recoverable after post-implantation rapid thermal processing. Such conventional fin structures may include, for example, chevron polycrystalline defects in portions of the fin structure coincident with the single crystalline regions 112a and 112b of the embodiment of FIG. 1. As discussed below, the FinFET device 102 of FIG. 1 may be achieved through a novel combination of implant mask material, etching and high temperature implantation.

Referring to FIGS. 2A-2E and 3A-3E, there is shown an exemplary technique for forming a three dimensional (3D) device 200 according to one embodiment of the present disclosure. For clarity and simplicity, the present embodiment may focus on the technique for forming a 3D CMOS device comprising at least one n-type device disposed on n-type side 212 and at least one p-type device disposed on p-type side 214. As described in detail below, the 3D device 200 may be a CMOS device comprising one or more n-type devices disposed on the n-type or first side 212 of the 3D device 200 and one or more p-type devices disposed on the p-type or second side 214. In the FIGS. 2A-2E a side cross-sectional view of the 3D device 200 is illustrated, while in FIGS. 3A-3E top plan view of the 3D device is shown.

Initially, a substrate 102 is prepared (FIGS. 2A, 3A). The substrate 102 may comprise a semiconductor base 102a such as Si, and an oxide layer 102b formed thereon. The substrate 102 may define a horizontal surface 105 that lies within a plane parallel to the X-Y plane of the Cartesian coordinate system illustrate. In addition, a plurality of fin structures 103 may extend vertically, above the oxide layer 102b in the Z-direction. Each fin structure 103 may have a pair of opposing sidewalls 103a, 103b that extend vertically as shown, where the width of the fin structure 103 is defined by the distance between opposing sides 103a, 103b.

At least one fin structure 103 may be disposed on the n-type side 212 and at least one fin structure 103 may be disposed on the p-type side 214. On such a substrate 102, a hardmask 222 may be deposited. In the present disclosure, the hardmask 222 may be deposited using various deposition processes, such as chemical vapor deposition (CVD) process, physical vapor deposition (PVD) process, plasma enhanced chemical vapor deposition (PECVD) process, atomic layer deposition (ALD) process, and other deposition processes. However, a process that enables conformal, gap filling, and planarized deposition on high aspect ratio structures may be desired.

At the same time, the materials preferred as the hardmask 222 may be those that are inert, chemically and electrically, toward the fin structure 103 and the dopants implanted therein; that are capable of being deposited conformally around 3D structures, which may result in good gap-filling or step coverage to provide thickness control on isolated open structures in comparison to dense structures; that are capable of being deposited and remain stable at high temperature, exhibiting no shrinkage or expansion; that are capable of withstanding harsh ion implant conditions to provide adequate masking protection against undesired implantation; that are capable of being removed readily at elevated temperature; that exhibit good etch selectivity with respect to a Si containing structure or film (e.g., $SiO_2$, SiN, SiC, etc. . . . ). In addition, material in which planarization can be controlled may be preferred. Further, materials may be preferred that provide near neutral stress which may help to avoid bending of a fin structure or line bending and to avoid structuralal damage. Although various materials may meet one or more requirements noted above, a carbon based hardmask 222 that includes a graphite (or graphite-like) or amorphous structure, including mixtures of SP1, SP2, and SP3 bonding, may be preferred in the present disclosure. Such a hardmask 222 may be deposited with sufficient thickness to provide sufficient masking against undesired ion implantation.

In the example of FIGS. 2A, 3A, the hardmask 222 deposition may be followed by optional planarization of the hardmask 222 if needed. This may then be followed by a blanket deposition of resist 224 (e.g. photoresist) on the hardmask 222, which may be subsequently patterned to selectively expose a portion of the hardmask 222, as shown in FIGS. 2B, 3B. In the present embodiment, the portion of the hardmask 222 exposed may be the portion disposed on the n-type side 212. However, those of ordinary skill in the art will recognize that in another embodiment the portion of the hardmask 222 disposed on the p-type side 214 may be exposed. Those of ordinary skill in the art will also recognize that various resist patterning processes, including photolithography process, may be used to pattern and expose a portion of the hardmask 222 that lies under the resist 224.

Thereafter, as illustrated in FIGS. 2C,3C, the pattern of the resist 224 may be transferred to the hardmask 222 by selectively etching the hardmask 222 to expose the fin structures 103 disposed on the n-type side 212. Preferably, the hardmask 222 that lies on the n-type side 212 is etched while maintaining the integrity of the fin structure 103 in the n-type side 212. In the present embodiment, the selective etching of the hardmask 222 is achieved with species excluding oxygen (O) and/or fluorine (F) species. In the present embodiment, the species used to etch the hardmask 222 may include hydrogen (H) species such as H ions or $H_2$ gas or other H-containing material that does not contain either O species or F species. In some embodiments in which the hardmask 222 comprises a carbon species (material), the etchant species used to etch the hardmask may comprise hydrogen or hydrogen that is diluted with inert gas, nitrogen, or a combination of the two. This type of etchant may remove the carbon material through a C—H chemical reduction process.

As the hardmask 222 on the n-type side 212 is selectively etched, the fin structure 103 therein may be exposed, as shown in FIGS. 2C, 3C Because the etching species may include hydrogen species, and may exclude O species and F species, selective etching of the hardmask 222 may be achieved with respect fin material such as silicon or silicon: germanium, or silicon: carbon; silicon oxide; and silicon nitride in some examples. Thus, the hardmask 222, which contains carbon, may be completely removed in the n-type side 212 without etching the semiconductor material of the fin structure 103 or oxide layer 102b. The etch removal of hardmask 222 may also take place without removing any thin oxide or nitride layers (not shown) that are disposed on the in structure 103 as liners. The selective etching or patterning of the hardmask 222 may be followed by removing of the resist 224 from the remaining hardmask 222, as illustrated in FIGS. 2D, 3D.

Thereafter, dopants may be conformally implanted into the fin structures 103 disposed in the n-type side 212. In the present embodiment, n-type dopants, in the form of ions 232, may be implanted conformally into the sidewalls 103a, 103b, and top wall 103c of the exposed fin structures 103, as shown in FIGS. 2D, 3D. Examples of the n-type dopants or ions 232 may include phosphorous (P), arsenic (As), and selenium (Sb) containing species. In the present embodiment, the ions 232 may be implanted while the fin structures 103 are maintained at an elevated temperature, for example, 400° C. or above. By maintaining the fin structures 103 at high temperature during ion implantation process, the fin structures 103 may be dynamically annealed to reduce the amorphization attributable to the ion implantation process. It is to be noted that the ions 232 may be directed at a non-zero angle with respect to the Z-direction in order to implant into sidewalls of the exposed fin structures 103. Because implantation temperature is not restricted by the lack of high temperature stability exhibited by photoresist used in conventional Fin-FET processing, the substrate temperature and ion energy may be adjusted for implantation of ions 232 to improve the doping process. This may result in improving of crystalline quality of the fin structures 103 after ion implantation and annealing.

As a result of the operations illustrated in FIGS. 2A-3E, n-type fin structures 204 may be generated, which may ultimately form a part of a nMOS FinFET device (not shown). During the ion implantation of n-type ions 232, the hardmask 222 remaining in the p-type side 214 may provide adequate protection against undesired ion implantation of n-type ions 232 into the fin structures 103 in the p-type side 214 (FIGS. 2D,3D). Moreover, the hardmask 222 may be chemically and mechanically stable at elevated implantation temperatures of 400° C., 500° C., or higher. In this manner, the implantation of n-type ions 232 may be conducted in a stable fashion, ensuring that ions 232 are implanted in desired regions of the 3D device 200, such as the n-type side 212, and are masked from implanting into undesired regions, such as the p-type side 214.

After forming the n-type fin structures 204, the hardmask 222 disposed in the p-type side may be removed (FIGS. 2E, 3E). During removal, the remaining hardmask 222 may be exposed to H containing species, without exposing the hardmask 222 to O or F containing species.

The selective process may then be performed on the fin structure 103 disposed on the p-type side 214. In particular, the hardmask 222 may be deposited on the substrate 102 and the fin structures 103 and the n-type fin structures 204, followed by the deposition of resist 224 (e.g. photoresist) on the hardmask 222. Thereafter, the resist 224 may be patterned to expose the hardmask 222 in the p-type side 214, and the etching process may be performed to remove the exposed hardmask 222 in the p-type side 214. Meanwhile, the hardmask 222 in the n-type side 212 may be maintained. After the hardmask 222 in the p-type side 214 is removed, the resist 224 on the remaining hardmask 222 disposed in the n-type side 212 may also be removed. After hardmask 222 in the p-type side 214 is removed, the fin structure 103 may be exposed. Meanwhile, the n-type fin structures 204 in the n-type side 212 may remain covered by the hardmask 222.

Thereafter, p-type dopants, in the form of ions may be implanted into the fin structure 103 in the p-type side 214. Much like the earlier ion implantation with n-type dopants 232, the p-type dopants may be implanted conformally into the sidewalls and top wall of the fin structures 103 in the p-type side 214. In the present disclosure p-type ions may include species containing boron (B), gallium (Ga), and/or indium (In). As a result, p-type fin structures (not shown) may be generated in the p-type side 214. After forming the p-type fin structures, the remaining hardmask 222 may be removed from the n-type side 212. It is to be noted that the thickness of the hardmask 222 that is used to cover the n-type side 212 for masking of a p-type ion implantation may differ from the thickness of the hardmask 222 used to mask the p-type side 214 for n-type ion implantation, as desired.

After formation of n-type fins 204 in the n-type side 212 and the p-type fins (not shown) in the p-type side 214, a CMOS device may be formed. Notably, after implantation of n-type dopants and removal of hardmask 222, an annealing process may be performed to activate the dopants. The annealing process may be any annealing process suitable for activation of dopants and in various embodiments may generate a substrate temperature in excess of 700° C. In some embodiments, a rapid thermal processing (RTP) process may be performed to activate dopants, which may entail generating substrate temperatures in excess of 900° C. Similarly, after implantation of p-type dopants, annealing, such as rapid thermal processing (RTP) process may be performed to activate dopants. In some embodiments a single anneal process, such as RTP process may be performed after n-type and p-type implantation takes place.

In embodiments in which the implantation process is a source/drain implantation process or a source/drain extension implantation process, ions may be introduced at a dose of about $1E14$ $cm^{-2}$ to $1E16$ $cm^{-2}$. Notably, in such a process, a permanent gate or dummy gate may encompass a portion of fin structure during the implantation process. After annealing the peak dopant concentration in a desired portion of the exposed fin structure may be $1E20/cm^3$ or higher. Moreover, consistent with the present embodiments, even after being subject to ion doses as high as $1E16$ $cm^{-2}$ the exposed fin region that is implanted with dopants and annealed may comprise a single crystalline material after the annealing process. This is facilitated in part by the ability afforded by the thermal stability of the hardmask to tailor the implantation temperature over a range of elevated temperatures above 300° C., according to other implantation conditions including ion dose to be implanted into a fin structure.

It is further to be noted that in various embodiments, the selective processing of a 3D substrate or device illustrated herein using a carbon hardmask may be used in conjunction with any implantation process applied to a fin structure. Such a process may include, in addition to source/drain extension implantation and deep source/drain implantation, well implantation, halo implantation or other anti-punchthrough implant, and threshold voltage adjustment implantation, as examples. Moreover, 3D substrates or devices covered by the present embodiments include gate-all-around transistor devices in which a gate material surrounds a channel region on all four sides. Other embodiments may extend to ion implantation of any narrow three dimensional semiconductor structure in which implantation is performed at elevated temperature, for example, above 300° C.

An advantage provided by the present embodiments is that hardmask layers may be applied and selectively removed multiple times without affecting underlying nitride, oxide, or silicon structures or materials due to etch selectivity provided by the use of a hydrogen-based etchant that excludes fluorine and oxygen for etching graphite or a mixed bonding (sp1, sp2, sp3) carbon material disposed on any of the aforementioned materials. Moreover the large temperature range over which such a carbon film is stable increases flexibility for designing ion implantation temperature to suit the particular device constraints, such as fin width, RTP processing temperature, ion dose, and so forth. Thus, the processing illustrated in FIGS. 2A-3E may be applied modularly to any combination of ion implantation structure and annealing of a narrow semiconductor that may be used during device fabrication.

In the present disclosure, various systems may be used to introduce dopants in the form of ions. In one embodiment, an exemplary beamline ion implantation system may include an ion source that is configured to generate ions. Among such ion sources are an inductively heated cathode (IHC) ion source, a Freeman source and RF ion source. Downstream of an ion source, a substrate such as the substrate 102 may be disposed. Between ion source and substrate, a beamline implantation system may optionally include a series of beam-line components. If included, beam-line components may include at least one of the extraction system, mass slit, a scanner, the mass analyzer, one or more acceleration or deceleration lenses, collimating magnet, beam scanner, and other components capable of manipulating the ions into an ion beam having desired size, shape, energy, species, angle, and other characteristics. In operation, ions of desired implant species are generated within the ion source. To generate the ions, a processing material containing a desired implant species is introduced into the ion source, where the material is ionized and a plasma containing the ions is generated. Preferably, the processing material containing the dopants species in gaseous or vapor form is used. However, the present disclosure does not preclude introducing the processing material in a solid form into an ion source.

Thereafter, ions generated in an ion source may be directed toward the substrate 102. While being directed toward the substrate 102, ions may be manipulated to desired size, shape, energy, species, angle, and other characteristics. During ion implantation, the substrate 102 may be maintained at elevated temperature (e.g., 400° C. or greater) with a heater disposed near the substrate 102. In one embodiment, the heater may be a platen that supports the substrate 102 during ion implantation process.

In other embodiments, an ion implantation system may include a chamber in which the substrate 102 is disposed and a plasma source proximate to the chamber. Examples of a plasma source include a radio frequency (RF) plasma source or microwave (MW) plasma source. In some embodiment, a plasma source may be a remote plasma source spaced apart from a chamber that houses the substrate 102. In the present disclosure, a plasma source may provide sufficient energy to ionize the processing material contained in a chamber housing the substrate 102 and may generate a plasma containing, among others, ions of desired dopant species. The ions of desired species may be directed toward the substrate 102 by, for example, negatively biasing the substrate 102 to attract the positively charged ions of desired dopant species. During ion implantation the temperature of the substrate 102 may be maintained at an elevated temperature (e.g., 400° C. or above) by a heater provided near substrate 102. In some embodiments, the heater may be a platen that supports the substrate 102.

Herein a new technique for selectively processing a 3D device is disclosed. For clarity and simplicity, the present disclosure focuses on a technique for selectively processing FinFET devices. However, those of ordinary skill in the art will recognize that the present disclosure may be just as applicable to a substrate or device containing other 3D structures. As such, the present disclosure is not to be limited in scope by the specific embodiments described herein. Other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A method to selectively process a three dimensional device, comprising:
   providing a substrate having a first surface that extends horizontally, the substrate comprising a fin structure containing a second surface that extends vertically from the first surface;
   providing a film atop and in direct contact with the fin structure of the substrate, the film comprising carbon species, and the substrate and the fin structure comprising a semiconductor material including silicon; and
   etching a selected portion of the film selective to the fin structure of the substrate by exposing the selected portion of the film to an etchant containing hydrogen species, the etchant excluding oxygen species and fluorine species.

2. The method of claim 1, wherein the carbon species contains at least one of graphitic and amorphous structure.

3. The method of claim 1, wherein the carbon species contains a mixture of sp1, sp2, and sp3 bonding.

4. The method of claim 1, wherein the film comprises a stress having a value less than 0.1 gigapascal.

5. The method of claim 1, wherein the etchant comprises hydrogen or hydrogen diluted with inert gas, nitrogen or both, and wherein the carbon species is removed through a C—H chemical reduction process.

6. The method of claim 1, further comprising implanting the fin structure with a dopant species.

7. The method of claim 6, further comprising maintaining a temperature of the substrate at a substrate temperature of 400° C. or higher during the implanting.

8. The method of claim 6, wherein the fin structure comprises a portion of a FinFET device, the implanting comprising performing a first implant to implant a first dopant species of a first type when an unetched portion of the film is disposed on the portion of the FinFET device.

9. The method of claim 8, wherein the film is a first film, the selected portion of the film is a first selected portion that is disposed on a first region of the substrate, the method further comprising:
   removing the unetched portion of the film after the first implant;
   depositing a second film comprising carbon species on the substrate;
   etching a second selected portion of the second film that is disposed on a second region of the substrate different from the first region by exposing the second selected portion of the film to an etchant containing hydrogen species; and
   performing a second implant to implant second dopant species of a second dopant type different from the first dopant type when an unetched portion of the second film is disposed on the FinFET device.

10. The method of claim 1, wherein the etching the selected portion of the film comprises:
    depositing a photoresist material on the film;
    removing the photoresist material from a region adjacent the selected portion; and
    etching the selected portion while the photoresist is disposed on another portion of the film.

11. The method of claim 1, wherein the etching the selected portion of the film does not etch silicon, silicon oxide or silicon nitride.

12. A method to process a FinFET device, comprising:
    providing a substrate having a first surface that extends horizontally, the substrate comprising a fin structure having a pair of opposed surfaces extending vertically from the first surface;
    providing a film atop and in direct contact with the fin structure of the substrate, the film comprising carbon species, and the substrate and the fin structure comprising a semiconductor material including silicon;
    etching a selected portion of the film that covers the fin structure, selective to the fin structure of the substrate, by exposing the selected portion of the film to an etchant containing hydrogen species and excluding oxygen species and fluorine species, wherein an exposed fin region is formed on the fin structure; and
    performing an ion implantation process into the exposed fin region to introduce a dopant at a substrate temperature of greater than 300° C.

13. The method of claim 12, wherein the carbon species contains at least one of graphitic and amorphous structure having a mixture of sp1, sp2, and sp3 bonding.

14. The method of claim 12, wherein the etchant comprising hydrogen or hydrogen diluted with inert gas, nitrogen, or both, wherein the carbon species is removed through a C—H chemical reduction process.

15. The method of claim 12, wherein the film is a first film, the selected portion of the film is a first selected portion that is disposed on a first region of the substrate and the exposed fin region is a first exposed fin region, the method further comprising:
    removing the unetched portion of the film after the first implant;
    depositing a second film comprising carbon species on the substrate;
    etching a second selected portion of the second film that is disposed on a second region of the substrate different from the first region by exposing the second selected portion of the film to an etchant containing hydrogen species, wherein a second exposed fin region is formed; and
    performing a second implant to implant second dopant species of a second dopant type different from the first dopant type into the exposed fin region.

16. The method of claim 12, wherein the etching the selected portion of the film does not etch silicon, silicon oxide or silicon nitride.

17. The method of claim 12, wherein the performing the implantation process comprises implanting the dopant species at a dose of $1E14\ cm^{-2}$ to $1E16\ cm^{-2}$.

18. The method of claim 12, further comprising performing an annealing process after the performing the implantation process, wherein the exposed fin region comprises a single crystalline material after the annealing process.

19. The method of claim 18, wherein the peak dopant concentration of the activated dopant layer is $1E20/cm^3$ or higher.

* * * * *